(12) United States Patent
Soto (10) Patent No.: US 12,224,161 B2
(45) Date of Patent: Feb. 11, 2025

(54) LOW TEMPERATURE MANIFOLD ASSEMBLY FOR SUBSTRATE PROCESSING SYSTEMS

(71) Applicant: LAM RESEARCH CORPORATION, Fremont, CA (US)

(72) Inventor: Gabriel De Jesus Soto, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 224 days.

(21) Appl. No.: 18/013,699

(22) PCT Filed: May 5, 2022

(86) PCT No.: PCT/US2022/027757
§ 371 (c)(1),
(2) Date: Dec. 29, 2022

(87) PCT Pub. No.: WO2022/245545
PCT Pub. Date: Nov. 24, 2022

(65) Prior Publication Data
US 2023/0352276 A1 Nov. 2, 2023

Related U.S. Application Data

(60) Provisional application No. 63/190,493, filed on May 19, 2021.

(51) Int. Cl.
*H01J 37/32* (2006.01)
*C23C 16/46* (2006.01)
(Continued)

(52) U.S. Cl.
CPC ...... *H01J 37/32522* (2013.01); *C23C 16/463* (2013.01); *H01J 37/32724* (2013.01);
(Continued)

(58) Field of Classification Search
CPC .............. C23C 16/463; H01J 37/32522; H01J 37/32724; H01J 37/32889;
(Continued)

(56) References Cited

U.S. PATENT DOCUMENTS

| 6,063,199 A | * | 5/2000 | Sajoto | C23C 16/4409 118/715 |
| 6,077,562 A | * | 6/2000 | Dornfest | C23C 16/4409 117/88 |

(Continued)

FOREIGN PATENT DOCUMENTS

| DE | 69535114 T2 | * | 2/2007 | ......... C23C 16/4401 |
| KR | 20170000360 A | * | 1/2017 | |

(Continued)

OTHER PUBLICATIONS

International Search Report and Written Opinion of the ISA issued in PCT/US2022/027757, mailed Aug. 23, 2022; ISA/KR.

*Primary Examiner* — Ljiljana V. Ciric (57) ABSTRACT

A manifold assembly for a processing chamber in a substrate processing system includes a manifold. The manifold includes a first valve assembly configured to flow a liquid coolant at a first temperature from a first channel of a coolant assembly to the processing chamber. The first valve assembly is configured to flow the liquid coolant at a cryogenic temperature. The manifold further includes a first weldment block including tubing associated with the first valve assembly, a second valve assembly configured to flow the liquid coolant at a second temperature greater than the first temperature from a second channel of the coolant assembly to the processing chamber, and a second weldment block including tubing associated with the second valve assembly. An insulative housing enclosing the first valve assembly, the first weldment block, and the second weldment block. The insulative housing is comprised of a plurality of layers of an insulative material.

21 Claims, 5 Drawing Sheets

(51) Int. Cl.
*H01L 21/67* (2006.01)
*H01L 21/683* (2006.01)

(52) U.S. Cl.
CPC .......... *H01J 37/32889* (2013.01); *H01L 21/67069* (2013.01); *H01L 21/67103* (2013.01); *H01L 21/6831* (2013.01); *H01L 21/6833* (2013.01); *H01J 2237/002* (2013.01); *H01J 2237/2001* (2013.01); *H01J 2237/334* (2013.01)

(58) Field of Classification Search
CPC ......... H01J 2237/002; H01J 2237/2001; H01J 2237/334; H01L 21/67069; H01L 21/67103; H01L 21/6831; H01L 21/6833
See application file for complete search history.

(56) References Cited

U.S. PATENT DOCUMENTS

| | | | |
|---|---|---|---|
| 6,258,170 B1 * | 7/2001 | Somekh | C23C 16/45561 392/394 |
| 10,283,382 B2 | 5/2019 | Noh et al. | |
| 11,373,893 B2 * | 6/2022 | Sarode Vishwanath | H01L 21/67248 |
| 11,694,902 B2 * | 7/2023 | Nittala | H01L 21/67069 438/694 |
| 2008/0035306 A1 * | 2/2008 | White | H01L 21/67109 118/58 |
| 2012/0006493 A1 * | 1/2012 | White | C23C 16/463 156/345.52 |
| 2013/0320208 A1 | 12/2013 | Lee et al. | |
| 2015/0364350 A1 * | 12/2015 | White | H01L 21/67103 118/724 |
| 2017/0250060 A1 | 8/2017 | Lubomirsky et al. | |
| 2021/0082730 A1 | 3/2021 | Sarode Vishwanath et al. | |
| 2022/0130645 A1 * | 4/2022 | Kobune | H01J 37/32522 |
| 2023/0317463 A1 * | 10/2023 | Nittala | C23C 16/56 |
| 2023/0352276 A1 * | 11/2023 | Soto | H01J 37/32724 |

FOREIGN PATENT DOCUMENTS

| | | | | |
|---|---|---|---|---|
| KR | 10-2018-0074013 A | | 7/2018 | |
| KR | 20200023987 A | * | 3/2020 | |
| KR | 20220117945 A | * | 8/2022 | |
| WO | WO-03-012567 A1 | | 2/2003 | |
| WO | WO-2008021668 A2 | * | 2/2008 | .......... B05C 13/00 |
| WO | WO-2020123069 A1 | * | 6/2020 | ........ H01J 37/32724 |

* cited by examiner

LOW TEMPERATURE MANIFOLD ASSEMBLY FOR SUBSTRATE PROCESSING SYSTEMS

CROSS-REFERENCE TO RELATED APPLICATIONS

This application is a U.S. National Phase Application under 35 U.S.C. 371 of International Application No. PCT/US2022/027757, filed on May 5, 2022, which claims the benefit of U.S. Provisional Application No. 63/190,493, filed on May 19, 2021. The entire disclosures of the applications referenced above are incorporated herein by reference.

FIELD

The present disclosure relates to cooling of substrate supports in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, dielectric etch, and/or other etch, deposition, or cleaning processes. A substrate may be arranged on a substrate support, such as a pedestal, an electrostatic chuck (ESC), etc. in a processing chamber of the substrate processing system. During etching, etch gas mixtures including one or more gases may be introduced into the processing chamber and plasma may be used to initiate chemical reactions.

SUMMARY

A manifold assembly for a processing chamber in a substrate processing system includes a manifold. The manifold includes a first valve assembly configured to flow a liquid coolant at a first temperature from a first channel of a coolant assembly to the processing chamber. The first valve assembly is configured to flow the liquid coolant at a cryogenic temperature. The manifold further includes a first weldment block including tubing associated with the first valve assembly, a second valve assembly configured to flow the liquid coolant at a second temperature greater than the first temperature from a second channel of the coolant assembly to the processing chamber, and a second weldment block including tubing associated with the second valve assembly. An insulative housing enclosing the first valve assembly, the first weldment block, and the second weldment block. The insulative housing is comprised of a plurality of layers of an insulative material.

In other features, the first valve assembly includes a cold supply valve arranged to supply the liquid coolant to the processing chamber, a cold return valve configured to receive the liquid coolant from the processing chamber, and a cold bypass valve in fluid communication with an inlet of the cold supply valve and an outlet of the cold return valve. The second valve assembly includes a hot supply valve arranged to supply the liquid coolant to the processing chamber, a hot return valve configured to receive the liquid coolant from the processing chamber, and a hot bypass valve in fluid communication with an inlet of the hot supply valve and an outlet of the hot return valve.

In other features, the manifold assembly further includes a first supply tube arranged to supply the liquid coolant from the coolant assembly to the first valve assembly, a first return tube arranged to supply the liquid coolant from the first valve assembly to the coolant assembly, a second supply tube arranged to supply the liquid coolant from the coolant assembly to the second valve assembly, and a second return tube arranged to supply the liquid coolant from the second valve assembly to the coolant assembly. The first supply tube, the first return tube, the second supply tube, and the second return tube are enclosed in conformal insulation comprised of a plurality of layers of the insulative material.

In other features, the plurality of layers of the insulative material alternate with a plurality of layers of a vapor barrier. Each of the plurality of layers of the insulative material has a thickness of less than or equal to 10 mm. The insulative housing includes an extension that encloses the first valve assembly but does not enclose the second valve assembly. The extension includes a cavity at least one of between and around valves of the first valve assembly. The extension includes a purge inlet and a purge outlet in fluid communication with the cavity.

In other features, a system includes the manifold assembly and further includes a purge assembly in communication with the purge inlet. The purge assembly is configured to selectively purge condensation from surfaces of the first valve assembly. A substrate processing system includes the manifold assembly and further includes a substrate support including a coolant channel in fluid communication with the manifold assembly.

In other features, the cryogenic temperature is at or below −60° C. and the insulative material has a thermal conductivity of less than 14 mW/m-K at −60° C.

A temperature control system for a processing chamber configured to perform cryogenic etching includes a coolant assembly and a manifold assembly. The coolant assembly is configured to provide liquid coolant at a first temperature via a first channel and provide liquid coolant at a second temperature via a second channel and a manifold assembly. The first temperature is a cryogenic temperature and the second temperature is greater than the first temperature. The manifold assembly includes a first supply valve configured to supply the liquid coolant from the first channel to the processing chamber at the first temperature that is a cryogenic temperature, a first return valve configured to return the liquid coolant from the processing chamber to the coolant assembly via the first channel, a second supply valve configured to supply the liquid coolant from the second channel to the processing chamber at a second temperature, and a second return valve configured to return the liquid coolant from the processing chamber to the coolant assembly via the second channel.

In other features, the cryogenic temperature is at or below −60° C., the temperature control system further includes an insulative housing enclosing the first supply valve and the first return valve, and the insulative housing is comprised of a plurality of layers of an insulative material having a thermal conductivity of less than 14 mW/m-K at −60° C. The insulative housing includes a plurality of layers of a vapor barrier alternating with the plurality of layers of the insulative material. Each of the plurality of layers of the insulative material has a thickness of less than or equal to 10 mm.

In other features, the temperature control system further includes a first supply tube arranged to supply the liquid coolant from the coolant assembly to the first supply valve, a first return tube arranged to return the liquid coolant from the first return valve to the coolant assembly, a second supply tube arranged to supply the liquid coolant from the coolant assembly to the second supply valve, and a second return tube arranged to return the liquid coolant from the second return valve to the coolant assembly. The first supply tube, the first return tube, the second supply tube, and the second return tube are enclosed in conformal insulation comprised of a plurality of layers of the insulative material.

In other features, the insulative housing includes a cavity defined at least one of between and around the first supply valve and the first return valve. The temperature control system further includes a purge assembly in fluid communication with the cavity via a purge inlet in the insulative housing. The purge assembly is configured to purge condensation from surfaces of first supply valve and the first return valve. The temperature control system further includes a first bypass valve in fluid communication with an inlet of the first supply valve and an outlet of the first return valve and a second bypass valve in fluid communication with an inlet of the second supply valve and an outlet of the second return valve.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Cooling systems may be configured to cool substrate supports such as electrostatic chucks (ESCs) with a coolant fluid. For example, coolant fluids such as high-pressure cooled gases or various liquid coolants flow through coolant channels in a baseplate of a substrate support. Cooling capacity and temperature range may be limited due to mechanical limitations. For example, closed cycle liquid chillers become very expensive as operational temperatures drop below −20° C. due to the need for multiple stages of cooling. Conversely, for closed-flow coolant gases, the gas flow required is relatively large, requiring the gas to be compressed to pressures in the range of hundreds of pounds per square inch. In applications requiring even greater cooling (e.g., cryogenic etching requiring temperatures below −20° C.), significant condensation may form on mechanical components of the cooling system such as a manifold, weldments, valves, etc. In some examples, components may freeze and interfere with operation and valves may fail.

A dual temperature control system according to the present disclosure implements a coolant assembly that provides accurate cooling at −60° C. or below while minimizing condensation during cryogenic etching. The coolant assembly includes a dual channel chiller (e.g., a coolant pump and reservoir) that supplies coolant to coolant channels of the substrate support via a manifold and valves. For example, the manifold includes two weldment blocks (e.g., a cold side and a hot side) configured to respectively supply and mix hot and cold coolant. Each of the weldment blocks includes three valves (e.g., a respective supply valve, return valve, and bypass valve). Accordingly, the coolant assembly is configured to provide separate hot and cold supply paths and separate hot and cold return paths to control coolant temperature in a wide range (e.g., from −60° C. or below to 80° C.).

The cold side weldment block and valves are enclosed in conformal insulation configured to maintain desired cooling temperatures and minimize condensation (e.g., Cryogel Z insulation). A gap or cavity is defined within the insulation and the weldment block. The cavity may be actively purged during cryogenic etching (e.g., with molecular nitrogen (N₂), compressed dry air, etc.) to prevent and/or remove condensation on the weldment block and valves.

Figure 1:
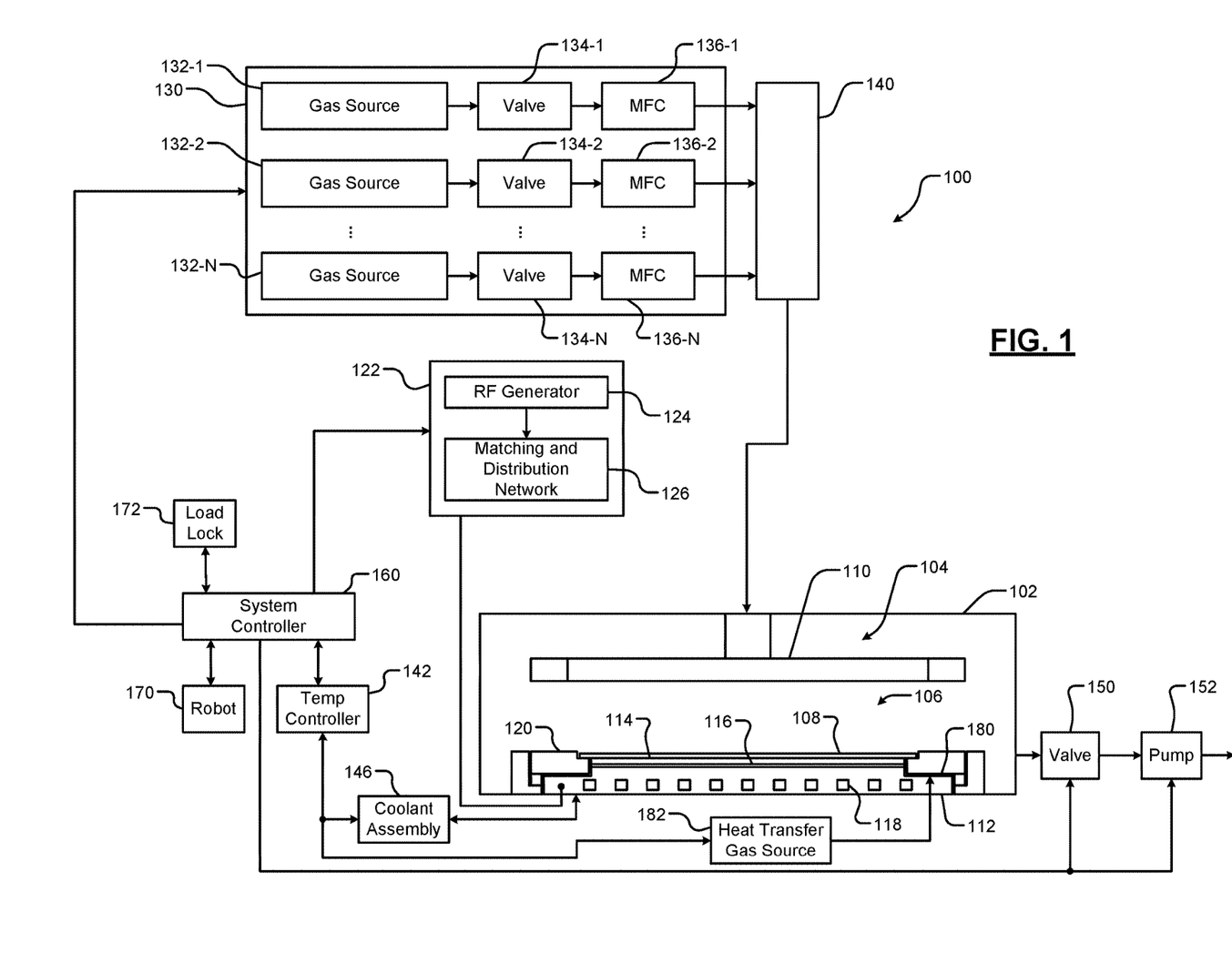
FIG. 1 is an example substrate processing system according to the present disclosure.

Referring now to FIG. 1, an example substrate processing system 100 is shown. For example only, the substrate processing system 100 may be used for performing cryogenic etching using RF plasma and/or other substrate processing. The substrate processing system 100 includes a processing chamber 102 that encloses other components of the substrate processing system 100 and contains the RF plasma. The substrate processing chamber 102 includes an upper electrode 104 and a substrate support 106, such as an ESC. During operation, a substrate 108 is arranged on the substrate support 106. While a specific substrate processing system 100 and processing chamber 102 are shown as an example, the principles of the present disclosure may be applied to other types of substrate processing systems and processing chambers, such as a substrate processing system that generates plasma in-situ or implements remote plasma generation and delivery (e.g., using a plasma tube, a microwave tube).

For example only, the upper electrode 104 may include a gas distribution device such as a showerhead 110 that introduces and distributes process gases. The showerhead 110 may include a stem portion including one end connected to a top surface of the processing chamber 102. A base portion is generally cylindrical and extends radially outwardly from an opposite end of the stem portion at a location that is spaced from the top surface of the processing chamber. A substrate-facing surface or faceplate of the base portion of the showerhead 110 includes a plurality of holes through which process gas or purge gas flows. Alternately, the upper electrode 104 may include a conducting plate and the process gases may be introduced in another manner.

The substrate support 106 includes a conductive baseplate 112 that acts as a lower electrode. The baseplate 112 supports a ceramic layer 114. A bond layer (e.g., an adhesive and/or thermal bond layer) 116 may be arranged between the ceramic layer 114 and the baseplate 112. The baseplate 112 may include one or more coolant channels 118 for flowing coolant through the baseplate 112. The substrate support 106 may include an edge ring 120 arranged to surround an outer perimeter of the substrate 108.

An RF generating system 122 generates and outputs an RF voltage to one of the upper electrode 104 and the lower electrode (e.g., the baseplate 112 of the substrate support 106). The other one of the upper electrode 104 and the baseplate 112 may be DC grounded, AC grounded or floating. In the present example, the RF voltage is supplied to the lower electrode. For example only, the RF generating system 122 may include an RF voltage generator 124 that generates the RF voltage that is fed by a matching and distribution network 126 to the upper electrode 104 or the baseplate 112. In other examples, the plasma may be generated inductively or remotely. Although, as shown for example purposes, the RF generating system 122 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more etch gases and mixtures thereof. The gas sources may also supply carrier and/or purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 110.

A temperature controller 142 may communicate with a coolant assembly 146 to control coolant flow through the channels 118. The coolant assembly 146 according to the present disclosure is configured as a dual channel chiller (e.g., including a coolant pump and reservoir) that supplies coolant to the coolant channels 118 via a manifold and valves as described below in more detail. The temperature controller 142 operates the coolant assembly 146 to selectively flow the coolant through the channels 118 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

In the substrate support 106 according to the present disclosure, an interface 180 is defined between the edge ring 120 and an upper surface of the baseplate 112. For example, the edge ring 120 may contact and be supported on the upper surface of the baseplate 112. A heat transfer gas such as helium is supplied from a heat transfer gas source 182 to the interface 180. The heat transfer gas facilitates cooling of the edge ring 120 (i.e., heat transfer from the edge ring 120 to baseplate 112. Although shown separately, the heat transfer gas source 182 may be implemented within the gas delivery system 130. The temperature controller 142 (and/or the system controller 160) may be configured to adjust a pressure of the heat transfer gas supplied to the interface 180 to adjust the temperature of the edge ring 120.

Figure 2:
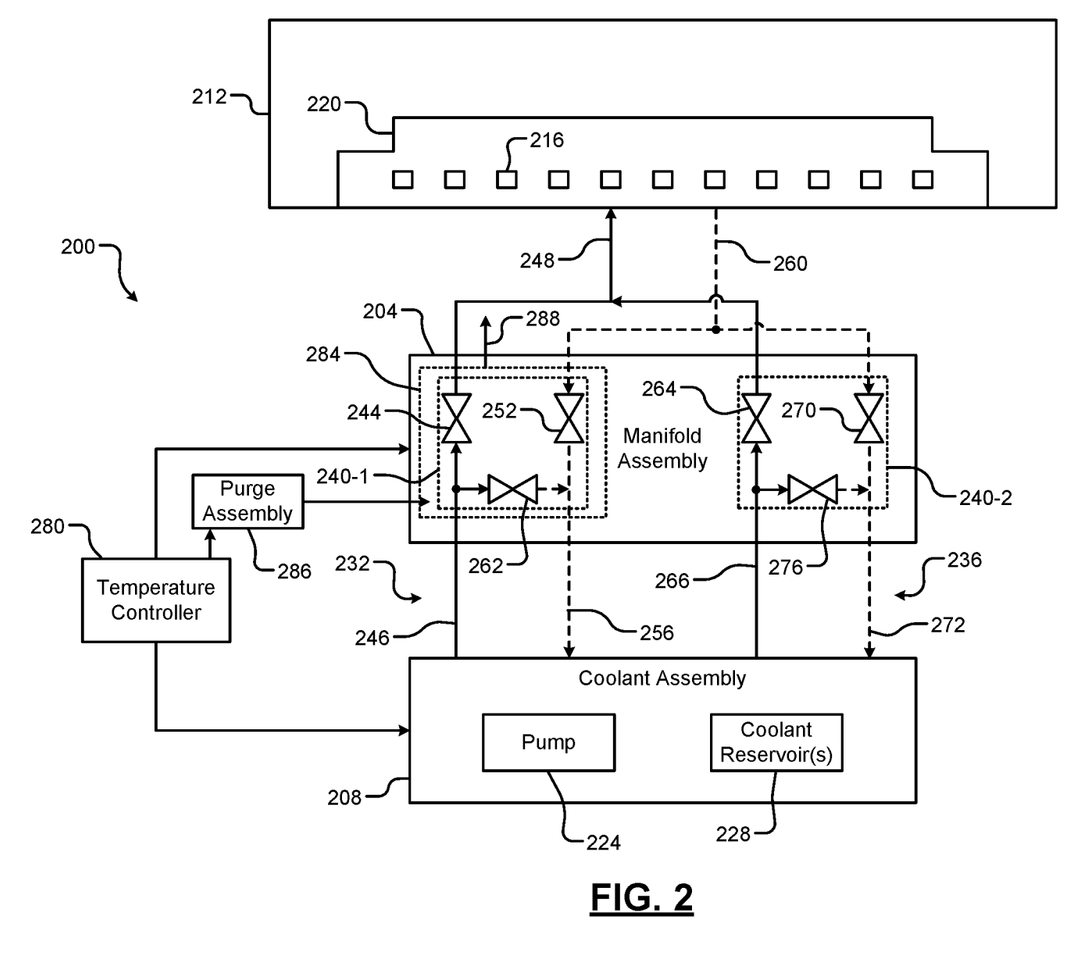
FIG. 2 is a temperature control system including an example manifold assembly according to the present disclosure.

Referring now to FIG. 2, a temperature control system (e.g., a dual temperature control system) 200 includes an example manifold assembly 204 according to the present disclosure. The manifold assembly 204 is arranged between a coolant assembly 208 and a processing chamber 212 (e.g., a process station or module). The temperature control system 200 and the manifold assembly 204 supply a liquid coolant to coolant channels 216 of a substrate support (e.g., a baseplate of a pedestal, ESC, etc.) 220. For example, the processing chamber 212 is configured to perform cryogenic etching on a substrate arranged on the substrate support 220.

The coolant assembly 208 and the manifold assembly 204 are configured to provide accurate cooling at a cryogenic temperature (e.g., at −60° C. or below) while minimizing condensation during cryogenic etching. For example, the coolant assembly 208 is configured as a dual channel chiller including a pump 224 and one or more coolant reservoirs 228 storing liquids at different temperatures. A first one of the coolant reservoirs 228 may store liquid coolant that is maintained in a first temperature range (e.g., from −60° C. or below to 20° C.) while a second one of the coolant reservoirs 228 stores liquid coolant that is maintained in a second temperature range (e.g., from 20° C. to 80° C.). Accordingly, the coolant assembly 208 provides coolant via both a cold side (e.g., a cold or cold-side channel 232 including cold supply and return tubing) and a hot side (e.g., a hot or hot-side channel 236 including hot supply and return tubing) to the manifold assembly 204.

The manifold assembly 204 includes a first (e.g., cold-side) weldment block 240-1 and a second (e.g., hot-side) weldment block 240-2, referred to collectively as weldment blocks 240. The weldment block 240-1 includes a cold supply valve 244 in fluid communication with a cold channel supply tube 246 and an inlet 248 of the coolant channels 216 and a cold return valve 252 in fluid communication with a cold channel return tube 256 and an outlet 260 of the coolant channels 216. In this manner, the coolant assembly 208 provides cold liquid coolant through the cold supply valve 244 of the weldment block 240-1 and cold liquid coolant returns to the coolant assembly 208 through the cold return valve 252 of the weldment block 240-1. In some examples, a cold bypass valve 262 is connected between an inlet of the cold supply valve 244 and an outlet of the cold return valve 252 to allow liquid coolant to flow in and out of the coolant assembly 208 to maintain temperature and pressure consistency when liquid coolant is not being supplied to the coolant channels 216 (i.e., when the cold supply valve 244 and the cold return valve 252 are closed).

Conversely, the weldment block 240-2 includes a hot supply valve 264 in fluid communication with a hot channel supply tube 266 and the inlet 248 of the coolant channels 216 and a hot return valve 270 in fluid communication with a hot channel return tube 272 and the outlet 260 of the coolant channels 216. In this manner, the coolant assembly 208 provides hot liquid coolant through the hot supply valve 264 of the weldment block 240-2 and hot liquid coolant returns to the coolant assembly 208 through the hot return valve 270 of the weldment block 240-2. In some examples, a hot bypass valve 276 is connected between an inlet of the hot supply valve 264 and an outlet of the hot return valve 270.

A temperature controller 280 controls the coolant assembly 208 and the manifold assembly 204 to supply liquid coolant to the substrate support 220 to maintain the substrate support 220 at a desired temperature. For example, the temperature controller 280 selectively supplies the liquid coolant from via the cold channel 232, the hot channel 236, and/or blends coolant from the cold channel 232 and the hot channel 236 by controlling the valves 244, 252, 264, and 270 to maintain the desired temperature.

At least the cold channel supply tube 246 and the cold channel return tube 256 are enclosed in conformal insulation to maintain coolant temperatures at or below −60° C. and minimize condensation as described below in more detail. For example only, the insulation includes Cryogel Z insulation. In some examples, other tubing (e.g., tubing coupled to the inlet 248 and the outlet 260, the hot channel supply tube 266, the hot channel return tube 272, etc.) is enclosed in the insulation.

An insulative housing (e.g., an insulation layer, blanket, etc.) 284 comprised of the conformal insulation encloses the cold-side weldment block 240-1. A gap or cavity (not shown in FIG. 2; described below in more detail) is defined within the insulation and the weldment block 240-1. For example, the cavity is defined around and/or between the cold supply valve 244, the cold return valve 252, and the cold bypass valve 262. The cavity may be actively purged during cryogenic etching (e.g., with compressed dry air) to prevent and/or remove condensation on the weldment block and valves. For example, a purge assembly (e.g., a purge gas source, purge valve, etc.) 286 in fluid communication with the cavity defined within the insulative housing 284 is configured to selectively flow purge gas (e.g., clean dry air) into the cavity to purge condensation. The purge assembly 286 may be responsive to the temperature controller 280, the system controller 160, etc. The purge gas and condensation are vented out of the insulative housing 284 via a purge vent or outlet 288 in communication with atmosphere.

Figure 3A:
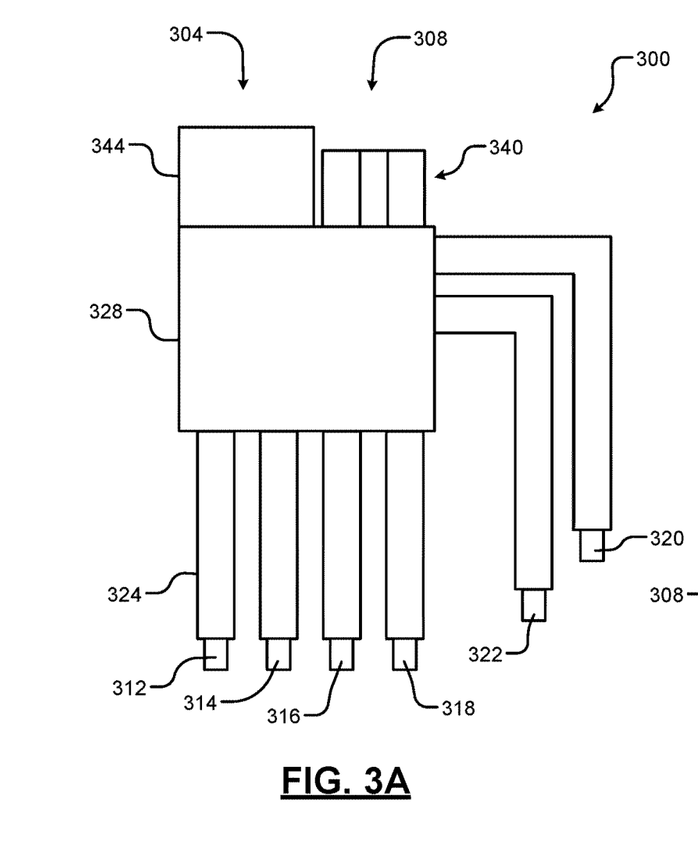
FIGS. 3A, 3B, and 3C show an example manifold assembly according to the present disclosure.
Figure 3B:
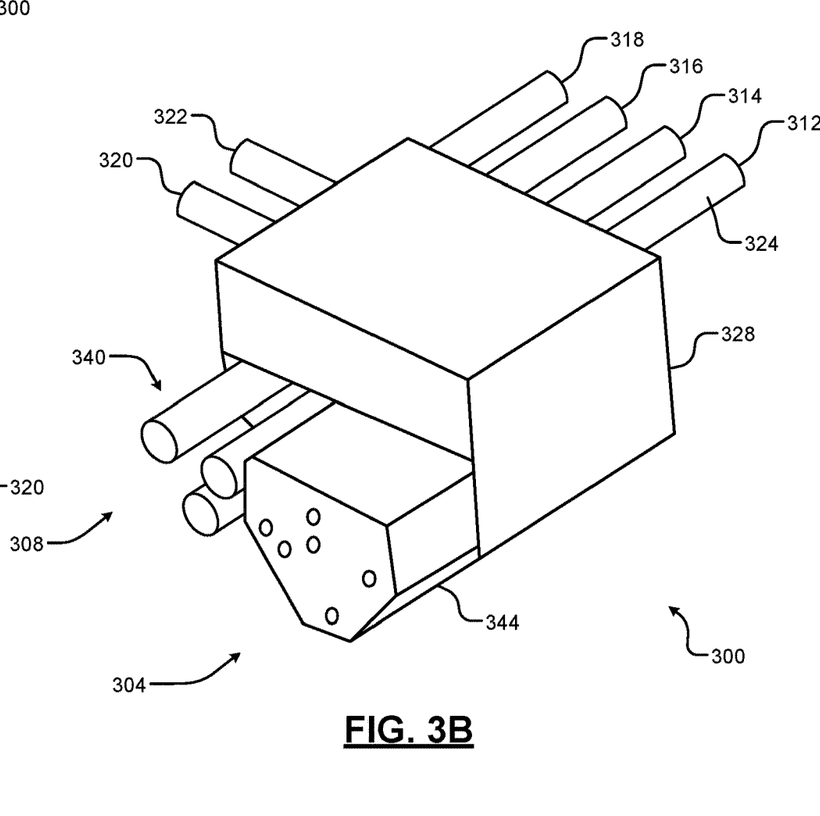
Figure 3C:
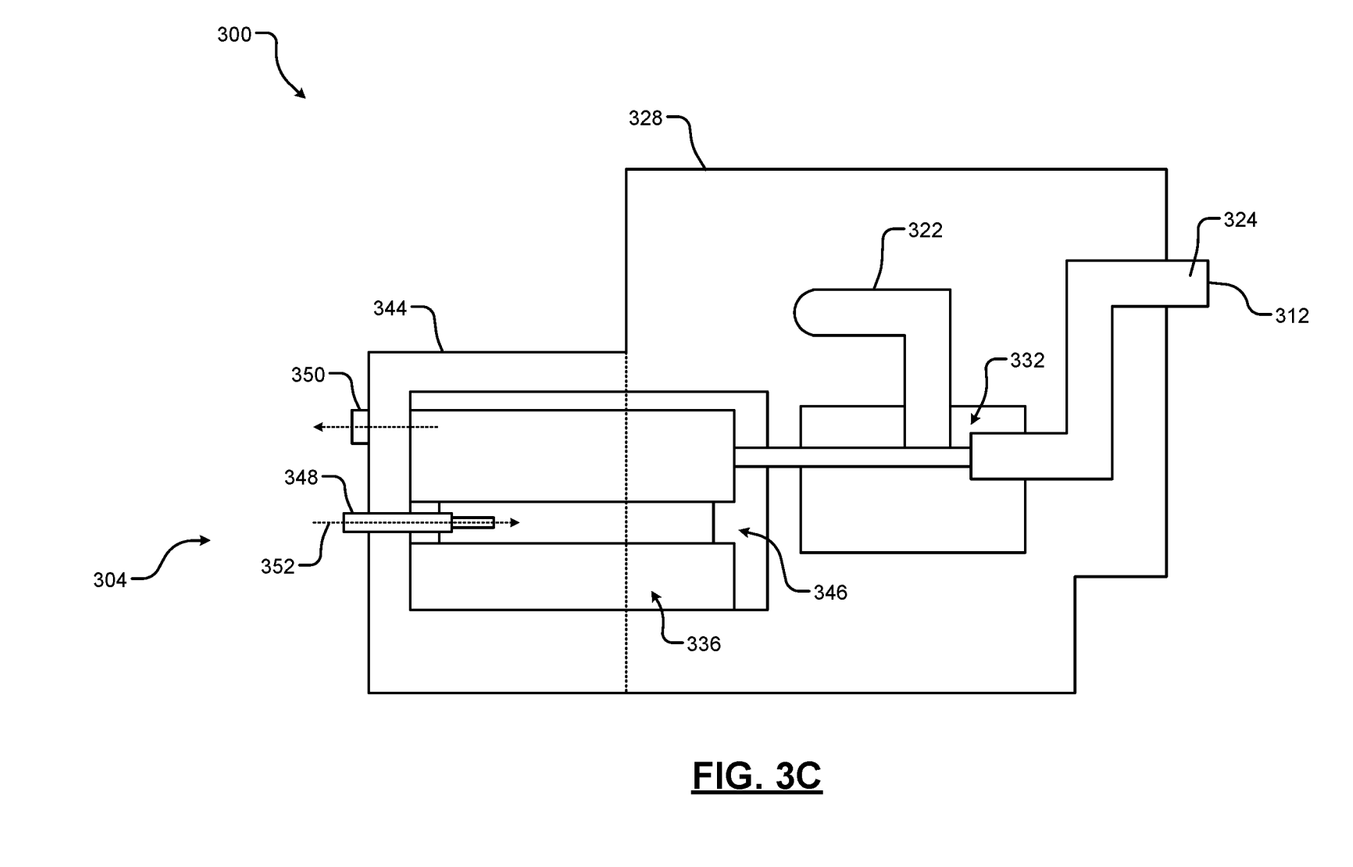

Referring now to FIGS. 3A, 3B, 3C, 3D, and 3E, an example manifold assembly 300 according to the present disclosure is shown. FIG. 3A is a plan view of the manifold assembly 300. FIG. 3B is an isometric view of the manifold assembly 300. FIG. 3C is a side cross-sectional view of the manifold assembly 300. The manifold assembly 300 includes a cold side 304 (e.g., corresponding to the cold-side channel 232, the cold-side weldment block 240-1, etc.) and a hot side 308 (e.g., corresponding to the hot-side channel 236, the hot-side weldment block 240-2). For example, the cold side 304 of the manifold assembly 300 includes a cold channel supply tube 312 and a cold channel return tube 314. The hot side 308 of the manifold assembly 300 includes a hot channel supply tube 316 and a hot channel return tube 318. A supply tube 320 supplies coolant from the manifold assembly 300 to coolant channels of a substrate support (e.g., via the inlet 248). A return tube 322 returns coolant to the manifold assembly 300 (e.g., via the outlet 260).

Each of the tubes 312, 314, 316, 318, 320, and 322 may be comprised of stainless steel and is enclosed in conformal insulation 324. For example, the conformal insulation 324 comprises one or more layers of insulative material, as described below in more detail. The manifold assembly 300 is enclosed in an insulative housing 328 also comprised of one or more layers of the insulation. As shown in FIG. 3C, the insulative housing 328 encloses a cold-side weldment block 332, a hot-side weldment block (not shown), and a cold-side valve assembly 336. The portions of the manifold assembly 300 enclosed within the insulative housing 328 are sealed from atmosphere.

As shown, the insulative housing 328 does not enclose a hot-side valve assembly 340. For example, the insulative housing 328 includes a compartment or extension 344 (shown in more detail in FIGS. 3D and 3E) that separately encloses the cold-side valve assembly 336. In this manner, the cold-side valve assembly 336 is isolated from the hot-side valve assembly 340 to maintain coolant temperatures and minimize condensation on the cold-side valve assembly 336.

Figure 3D:
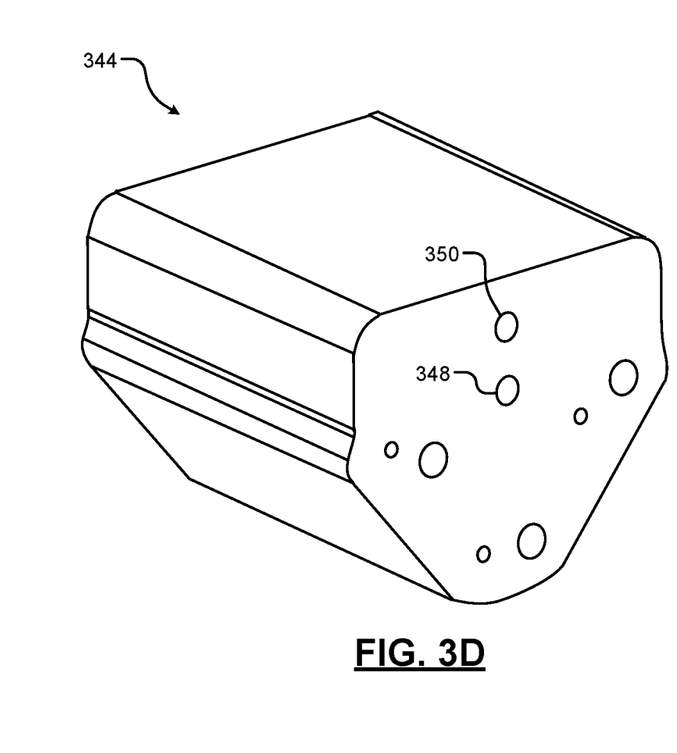
FIGS. 3D and 3E show an extension of an insulative housing of the manifold assembly of FIGS. 3A, 3B, and 3C.
Figure 3E:
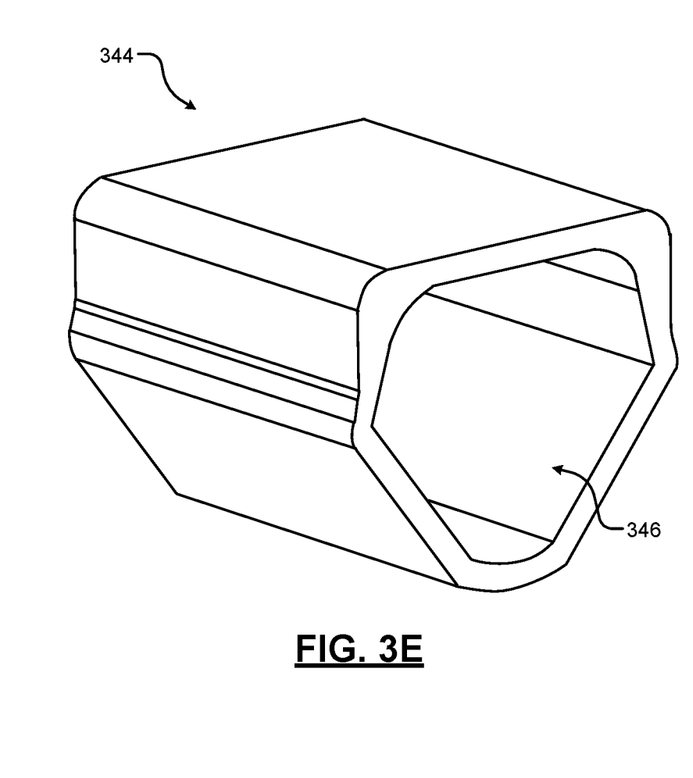

A cavity 346 is defined within the extension 344 of the insulative housing 328 around and between components (e.g., valves) of the cold-side valve assembly 336. A purge inlet 348 and a purge outlet or vent 350 are in fluid communication with the cavity 346. Accordingly, the cavity 346 may be actively purged during cryogenic etching (e.g., with compressed dry air 352) to prevent and/or remove condensation from within the cavity 346 as described above in FIG. 2. For example, flowing the compressed dry air 352 into the cavity 346 purges outside surface of the cold-side valve assembly 336. The cavity 346 without the cold-side valve assembly 336 is shown in FIG. 3E.

The conformal insulation 324 and the insulative housing 328 each comprise one or more layers of conformal (e.g., flexible or semi-flexible) insulative material having a very low thermal conductivity that decreases as temperature decreases. For example, the insulative material has a thermal conductivity of less than 18 mW/m-K at 100° C., between 14 and 18 mW/m-K at room temperature, and less than or equal to 14 mW/m-K at −60° C. For example only, the insulative material comprises a Cryogel Z blanket or film.

The conformal insulation 324 may be applied in multiple layers, such as alternating layers of the insulative material and a vapor barrier (e.g., a vapor barrier tape). For example, a first layer of the insulative material may be disposed adjacent to the corresponding tube, a first layer of the vapor barrier tape is disposed on the first layer of the insulative material, a second layer of the insulative material is disposed on the first layer of the vapor barrier tape, etc. In one example, the conformal insulation 324 includes at least three layers of the insulative material alternating with layers of the vapor barrier tape. Each layer of the insulative material may have a thickness of 10 mm or less (e.g., 5 mm).

Similarly, the insulative housing 328 is formed using multiple layers of the insulative material alternating with layers of the vapor barrier tape (e.g., at least three layers of the insulative material alternating with layers of the vapor barrier tape). Gaps between structural components within the insulative housing 328 (e.g., gaps around and between weldments, tubing, etc.) may be filled with an insulative gel, such as an aerogel. Conversely, the extension 344 of the insulative housing 324 is shaped to enclose the cold-side valve assembly 336 while also defining the cavity 346 as described above. In other words, the insulative material of the extension does not exactly conform (i.e., without gaps) to the cold-side valve assembly 336 and the cavity 346 is not filled with another material. In this manner, the cavity 346 facilitates purging of the surfaces of the cold-side valve assembly 336 as described above.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A manifold assembly for a processing chamber in a substrate processing system, the manifold assembly comprising:
   a manifold including
      a first valve assembly configured to flow a liquid coolant at a first temperature from a first channel of a coolant assembly to the processing chamber, wherein the first valve assembly is configured to flow the liquid coolant at a cryogenic temperature;
      a first weldment block including tubing associated with the first valve assembly,
      a second valve assembly configured to flow the liquid coolant at a second temperature from a second channel of the coolant assembly to the processing chamber, wherein the second temperature is greater than the first temperature, and a second weldment block including tubing associated with the second valve assembly; and an insulative housing enclosing the first valve assembly, the first weldment block, and the second weldment block, wherein the insulative housing is comprised of a plurality of layers of an insulative material.

2. The manifold assembly of claim 1, wherein (i) the first valve assembly includes a cold supply valve arranged to supply the liquid coolant to the processing chamber, a cold return valve configured to receive the liquid coolant from the processing chamber, and a cold bypass valve in fluid communication with an inlet of the cold supply valve and an outlet of the cold return valve, and (ii) the second valve assembly includes a hot supply valve arranged to supply the liquid coolant to the processing chamber, a hot return valve configured to receive the liquid coolant from the processing chamber, and a hot bypass valve in fluid communication with an inlet of the hot supply valve and an outlet of the hot return valve.

3. The manifold assembly of claim 1, further comprising a first supply tube arranged to supply the liquid coolant from the coolant assembly to the first valve assembly, a first return tube arranged to supply the liquid coolant from the first valve assembly to the coolant assembly, a second supply tube arranged to supply the liquid coolant from the coolant assembly to the second valve assembly, and a second return tube arranged to supply the liquid coolant from the second valve assembly to the coolant assembly.

4. The manifold assembly of claim 3, wherein the first supply tube, the first return tube, the second supply tube, and the second return tube are enclosed in conformal insulation comprised of a plurality of layers of the insulative material.

5. The manifold assembly of claim 1, wherein the plurality of layers of the insulative material alternate with a plurality of layers of a vapor barrier.

6. The manifold assembly of claim 1, wherein each of the plurality of layers of the insulative material has a thickness of less than or equal to 10 mm.

7. The manifold assembly of claim 1, wherein the insulative housing includes an extension that encloses the first valve assembly but does not enclose the second valve assembly.

8. The manifold assembly of claim 7, wherein the extension includes a cavity at least one of between and around valves of the first valve assembly.

9. The manifold assembly of claim 8, wherein the extension includes a purge inlet and a purge outlet in fluid communication with the cavity.

10. A system comprising the manifold assembly of claim 9 and further comprising a purge assembly in communication with the purge inlet.

11. The system of claim 10, wherein the purge assembly is configured to selectively purge condensation from surfaces of the first valve assembly.

12. A substrate processing system comprising the manifold assembly of claim 1 and further comprising a substrate support including a coolant channel in fluid communication with the manifold assembly.

13. The system of claim 1, wherein the cryogenic temperature is at or below −60° C. and the insulative material has a thermal conductivity of less than 14 mW/m-K at −60° C.

14. A temperature control system for a processing chamber configured to perform cryogenic etching, the temperature control system comprising:

a coolant assembly configured to (i) provide liquid coolant at a first temperature via a first channel and (ii) provide liquid coolant at a second temperature via a second channel; and a manifold assembly comprising a first supply valve configured to supply the liquid coolant from the first channel to the processing chamber at the first temperature, wherein the first temperature is a cryogenic temperature, a first return valve configured to return the liquid coolant from the processing chamber to the coolant assembly via the first channel, a second supply valve configured to supply the liquid coolant from the second channel to the processing chamber at the second temperature, wherein the second temperature is greater than the first temperature, and a second return valve configured to return the liquid coolant from the processing chamber to the coolant assembly via the second channel.

15. The temperature control system of claim 14, wherein the cryogenic temperature is at or below −60° C., the temperature control system further comprising an insulative housing enclosing the first supply valve and the first return valve, wherein the insulative housing is comprised of a plurality of layers of an insulative material having a thermal conductivity of less than 14 mW/m-K at −60° C.

16. The temperature control system of claim 15, wherein the insulative housing includes a plurality of layers of a vapor barrier alternating with the plurality of layers of the insulative material.

17. The temperature control system of claim 15, wherein each of the plurality of layers of the insulative material has a thickness of less than or equal to 10 mm.

18. The temperature control system of claim 15, further comprising:

a first supply tube arranged to supply the liquid coolant from the coolant assembly to the first supply valve;

a first return tube arranged to return the liquid coolant from the first return valve to the coolant assembly;

a second supply tube arranged to supply the liquid coolant from the coolant assembly to the second supply valve; and a second return tube arranged to return the liquid coolant from the second return valve to the coolant assembly, wherein the first supply tube, the first return tube, the second supply tube, and the second return tube are enclosed in conformal insulation comprised of a plurality of layers of the insulative material.

19. The temperature control system of claim 15, wherein the insulative housing includes a cavity defined at least one of between and around the first supply valve and the first return valve.

20. The temperature control system of claim 19, further comprising:

a purge assembly in fluid communication with the cavity via a purge inlet in the insulative housing, wherein the purge assembly is configured to purge condensation from surfaces of first supply valve and the first return valve.

21. The temperature control system of claim 14, further comprising:

a first bypass valve in fluid communication with an inlet of the first supply valve and an outlet of the first return valve; and
a second bypass valve in fluid communication with an inlet of the second supply valve and an outlet of the second return valve.

\* \* \* \* \*